United States Patent
Asahi (10) Patent No.: US 7,630,201 B2
(45) Date of Patent: Dec. 8, 2009

(54) HEAT RADIATING APPARATUS AND ELECTRONIC APPARATUS

(75) Inventor: Kazutoshi Asahi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 156 days.

(21) Appl. No.: 11/367,430

(22) Filed: Mar. 6, 2006

(65) Prior Publication Data

US 2007/0131409 A1  Jun. 14, 2007

(30) Foreign Application Priority Data

Dec. 14, 2005  (JP) .............................. 2005-360148

(51) Int. Cl.
H05K 7/20 (2006.01)

(52) U.S. Cl. ............... 361/695; 361/679.48; 361/679.5; 361/697; 165/104.33; 415/61; 417/2; 417/45; 454/184

(58) Field of Classification Search ............. 361/695, 361/697, 687; 165/80.3, 104.33, 121, 122, 165/185
See application file for complete search history.

(56) References Cited

U.S. PATENT DOCUMENTS

| | | | | |
|---|---|---|---|---|
| 3,991,819 | A * | 11/1976 | Clark | 165/59 |
| 5,137,428 | A * | 8/1992 | Poll et al. | 417/45 |
| 5,687,079 | A * | 11/1997 | Bauer et al. | 700/70 |
| 6,181,556 | B1 * | 1/2001 | Allman | 361/690 |
| 6,396,688 | B1 * | 5/2002 | Davies et al. | 361/687 |
| 6,398,505 | B1 * | 6/2002 | Sekiguchi | 417/2 |
| 6,496,368 | B2 * | 12/2002 | Jui-Yuan | 361/697 |
| 6,537,019 | B1 * | 3/2003 | Dent | 415/61 |
| 6,598,666 | B2 * | 7/2003 | Lin | 165/80.3 |
| 6,778,392 | B2 * | 8/2004 | Chiou | 361/697 |
| 6,920,045 | B2 * | 7/2005 | Huang et al. | 361/700 |
| 7,167,364 | B2 * | 1/2007 | Lopatinsky et al. | 361/697 |
| 7,277,280 | B2 * | 10/2007 | Peng | 361/695 |
| 2004/0000398 | A1 * | 1/2004 | Lee et al. | 165/185 |
| 2004/0145868 | A1 * | 7/2004 | Nair et al. | 361/694 |
| 2005/0241810 | A1 * | 11/2005 | Malone et al. | 165/122 |
| 2006/0142901 | A1 * | 6/2006 | Frankel et al. | 700/300 |
| 2006/0191668 | A1 * | 8/2006 | Lai | 165/104.33 |
| 2007/0091560 | A1 * | 4/2007 | Parker | 361/687 |
| 2007/0207721 | A1 * | 9/2007 | Chang | 454/184 |
| 2009/0097202 | A1 * | 4/2009 | Gipson | 361/695 |

FOREIGN PATENT DOCUMENTS

| | | |
|---|---|---|
| JP | 7-239390 | 9/1995 |
| JP | 2001-251077 | 9/2001 |
| JP | 2005-150401 | 6/2005 |

* cited by examiner

Primary Examiner—Jayprakash N Gandhi
Assistant Examiner—Courtney Smith
(74) Attorney, Agent, or Firm—Fujitsu Patent Center (57) ABSTRACT

While one of ventilation fans operates, the other ventilation fan is at rest. Air flows from the operating ventilation fan to the ventilation fan at rest. The airflow passes through an air passage defined in a heat radiating member located between the ventilation fans. Dust cumulates at the entrance of the air passage. The other ventilation fan is then driven to operate while the operating ventilation fan is brought to rest. Airflow is generated in the reverse direction. The airflow is inverted within the air passage. The inverted airflow serves to remove the dust from the entrance of the air passage. The cumulation of the dust can thus reliably be avoided. Accordingly, no dust filter is required in the path of airflow outside the air passage. Airflow of a sufficient amount can always be maintained in the air passage.

8 Claims, 6 Drawing Sheets

HEAT RADIATING APPARATUS AND ELECTRONIC APPARATUS

BACKGROUND OF THE INVENTION

1. Field of the Invention

The present invention relates to a heat radiating apparatus comprising: at least a pair of ventilation fans; and a heat radiating member received on a heat generating object in a space between the ventilation fans. The heat radiating member serves to define an air passage extending between the ventilation fans.

2. Description of the Prior Art

A heat radiating apparatus including an axial flow fan is well known as disclosed in Japanese Patent Application Publication No. 2005-150401, for example. The axial flow fan serves to introduce air into the enclosure of an electronic apparatus such as a personal computer through an opening defined in the enclosure of the electronic apparatus. The introduced air passes through an air passage defined in a heat radiating member. Heat is thus allowed to radiate from the heat radiating member in an efficient manner.

A dust filter is set in the opening of the enclosure. The dust filter serves to prevent dust outside the enclosure from entering the enclosure. Cumulation of dust can thus be prevented in the air passage in the heat radiating member. The dust filter, however, inevitably increases a resistance to the airflow at the opening. This results in a reduced amount of the introduced air. Airflow of a sufficient amount cannot be established in the air passage.

SUMMARY OF THE INVENTION

It is accordingly an object of the present invention to provide a heat radiating apparatus capable of reliably maintaining airflow of a sufficient flow amount within an air passage.

According to the present invention, there is provided a heat radiating apparatus comprising: at least a pair of ventilation fans; a heat radiating member received on a heat generating object in a space between the ventilation fans, the heat radiating member defining an air passage extending between the ventilation fans; and a controller circuit generating a control signal allowing the alternation of the ventilation fans.

While one of the ventilation fans is driven to operate, the other ventilation fan is at rest. Air flows from the operating ventilation fan to the ventilation fan at rest. The airflow passes through the air passage of the heat radiating member. Dust gradually cumulates at the entrance of the air passage. The other ventilation fan is then driven to operate while the operating ventilation fan is brought to rest. Airflow is in this manner generated in the reverse direction. The airflow is inverted within the air passage. The inverted airflow serves to remove the dust from the entrance of the air passage. The cumulation of the dust can thus reliably be avoided. Accordingly, no dust filter is required in the path of airflow outside the air passage. Airflow of a sufficient amount can always be maintained in the air passage. Since the ventilation fans alternately operate, the cumulation of the dust can reliably be prevented.

The controller circuit may time the operation of the ventilation fans in generation of the control signal. The operating time can be utilized to estimate a cumulative amount of the airflow from the operating ventilation fan. The ventilation fans are switched over depending on the estimated amount of the airflow. This structure serves to reliably avoid the cumulation of dust. The dust is reliably removed off before cumulation.

The heat radiating apparatus may be incorporated in an electronic apparatus, for example. The electronic apparatus may include: an enclosure; an electronic component disposed in the enclosure; at least a pair of ventilation fans disposed in the enclosure; a heat radiating member received on the electronic component in a space between the ventilation fans, the heat radiating member defining an air passage extending between the ventilation fans; and a controller circuit generating a control signal allowing an alternation of the ventilation fans.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
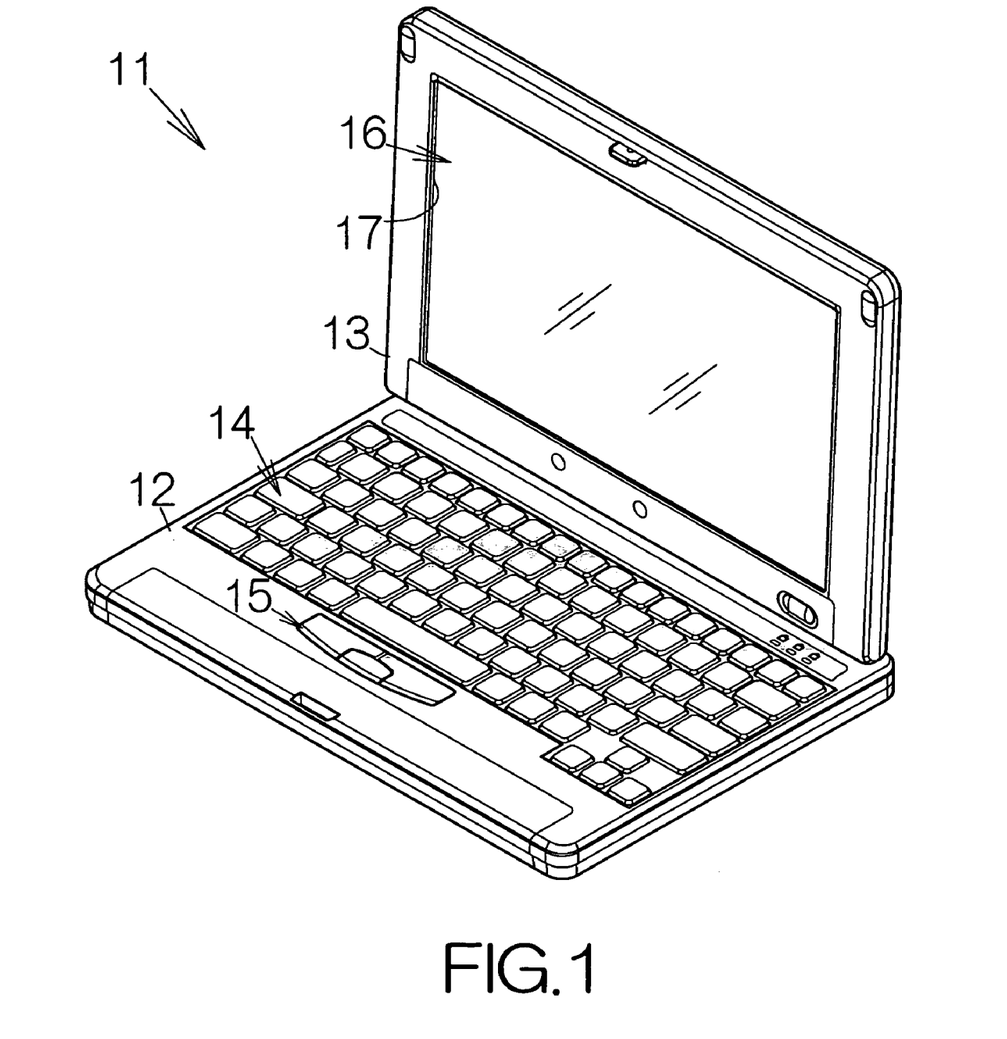
FIG. 1 is a perspective view schematically illustrating a notebook personal computer as a specific example of an electronic apparatus of the present invention.

FIG. 1 schematically illustrates a notebook personal computer 11 as a specific example of an electronic apparatus according to the present invention. The notebook personal computer 11 includes a thin main body 12 and a display enclosure 13 pivotably coupled to the main body 12. Input devices such as a keyboard 14 and a pointing device 15 are embedded in the front surface of the main body 12. Users manipulate the keyboard 14 and/or the pointing device 15 to input commands and/or data.

A liquid crystal display (LCD) panel module 16 is incorporated in the display enclosure 13, for example. The screen of the LCD panel module 16 is designed to get exposed in a window opening 17 defined in the display enclosure 13. Text data and graphics appear on the screen. Users can see the ongoing operation of the notebook personal computer 11 based on the appearing text data and graphics. The display enclosure 13 can be superimposed on the main body 12 through the pivotal movement relative to the main body 12.

Figure 2:
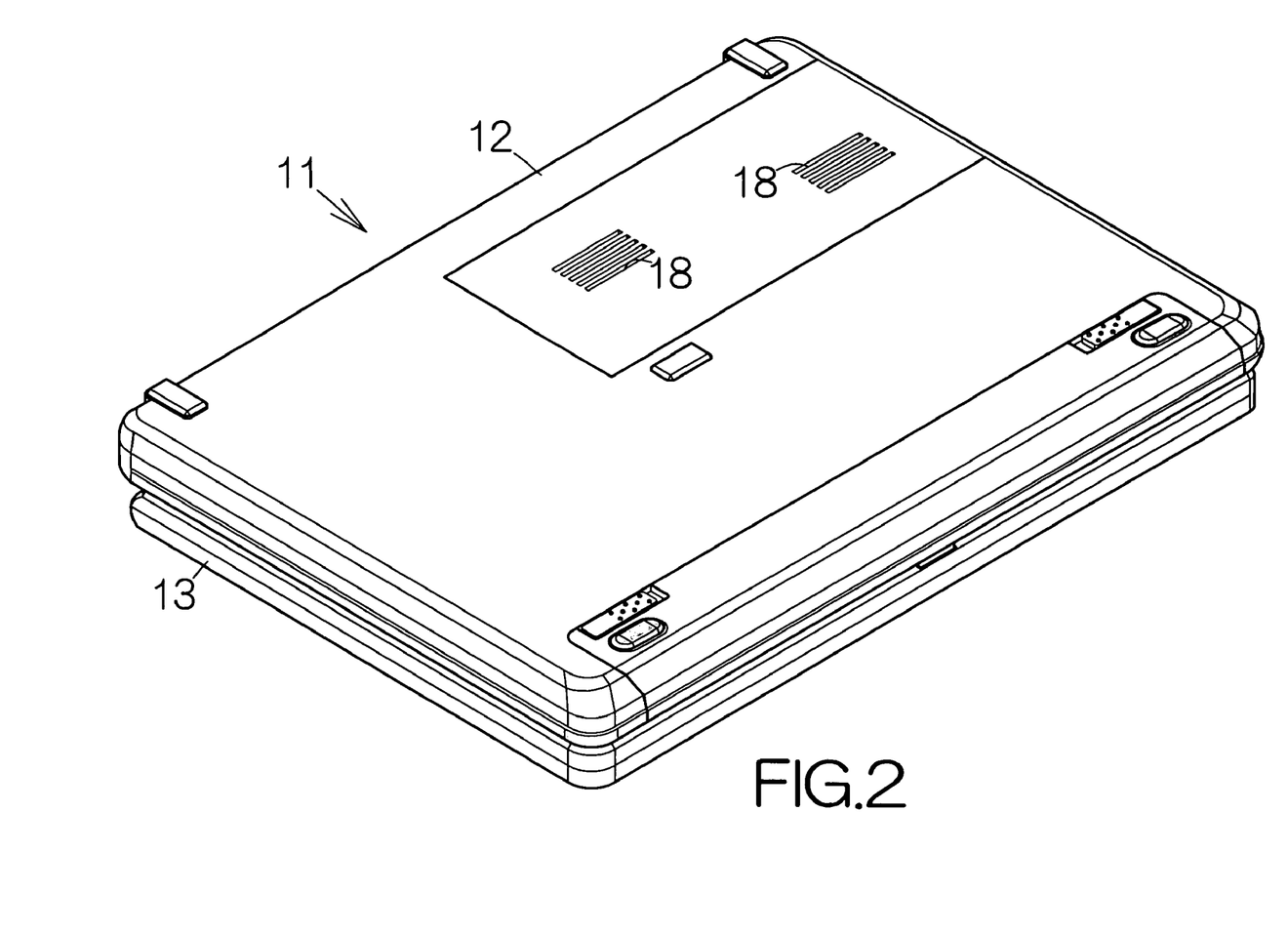
FIG. 2 is a perspective view of the notebook personal computer for schematically illustrating air vents defined in the bottom plate of the enclosure.
Figure 3:
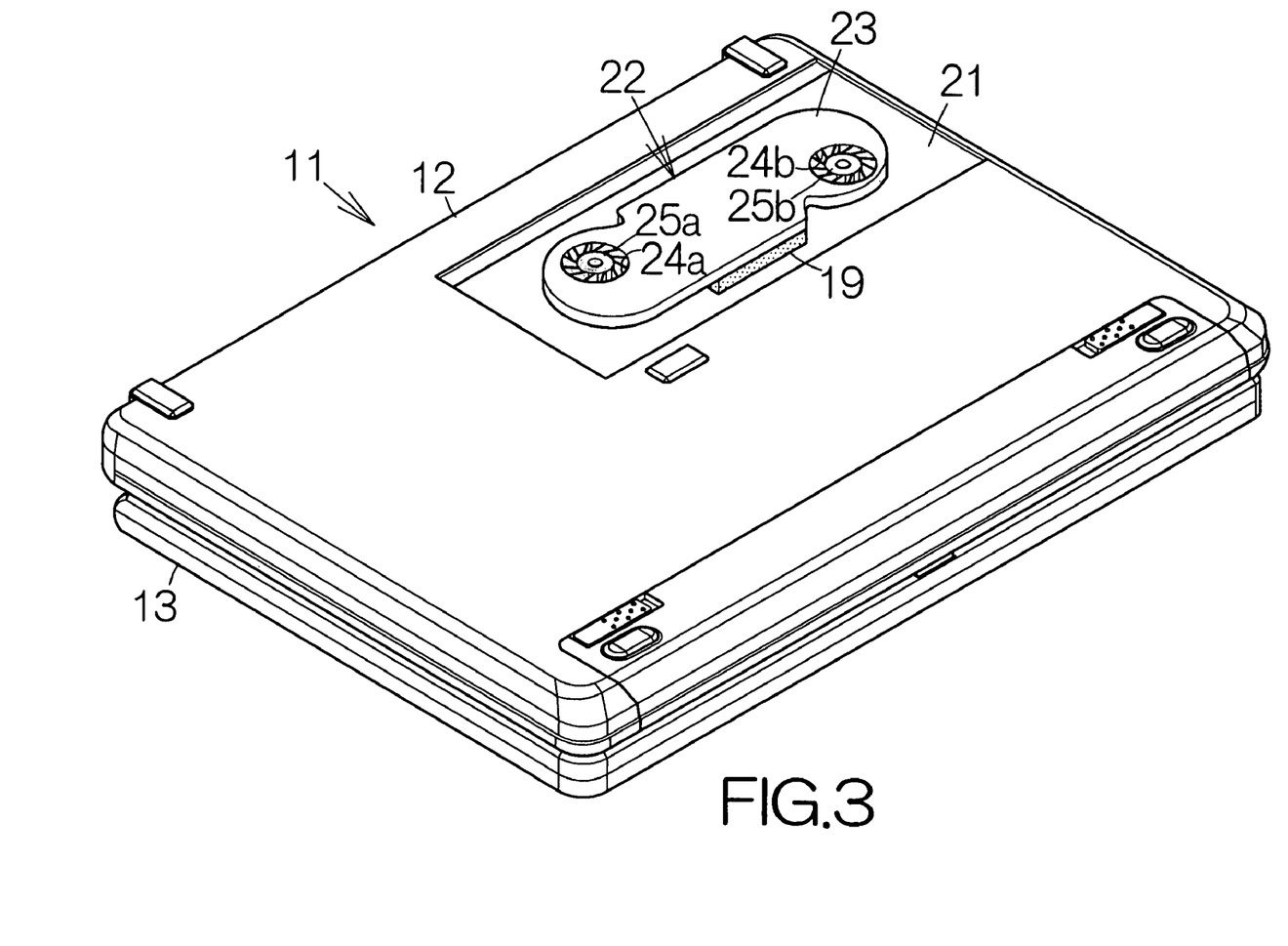
FIG. 3 is a perspective view of the notebook personal computer for schematically illustrating a heat radiating apparatus according to a first embodiment of the present invention.

As shown in FIG. 2, a pair of air vents 18, 18 is defined in the enclosure of the main body 12. The air vents 18, 18 serve to realize air circulation between the inner and outer spaces of the enclosure. As shown in FIG. 3, an electronic component such as a central processing unit (CPU) 19 is located inside the enclosure of the main body 12 near the air vents 18, 18. The CPU 19 may be mounted on a printed circuit board 21. A heat radiating apparatus 22 according to a first embodiment of the present invention is received on the upward surface of the CPU 19.

The heat radiating apparatus 22 includes a casing 23 serving as a heat sink. A pair of openings 24a, 24b is defined in the casing 23. The individual openings 24a, 24b serve to realize air circulation between the inner and outer spaces of the casing 23.

First and second ventilation fans 25a, 25b are disposed adjacent to the openings 24a, 24b, respectively. When the first ventilation fan 25a is driven to rotate, air is introduced into the casing 23 through the opening 24a. Likewise, when the second ventilation fan 25b is driven to rotate, air is introduced into the casing 23 through the opening 24b. The air introduced through the opening 24a is discharged through the opening 24b. The air introduced through the opening 24b is discharged through the opening 24a.

Figure 4:
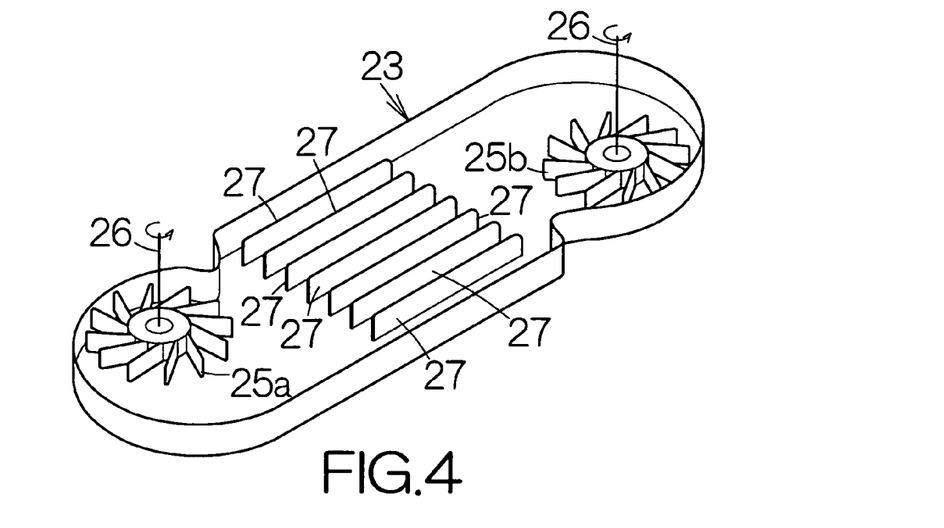
FIG. 4 is an enlarged perspective view schematically illustrating the structure of the heat radiating apparatus.

As shown in FIG. 4, so-called centrifugal fans are employed as the first and second ventilation fans 25a, 25b. The rotation axes 26, 26 of the first and second ventilation fans 25a, 25b are aligned with the centers of the openings 24a, 24b, respectively, for example. When the first or second ventilation fan 25a, 25b rotates around the rotation axis 26, air is introduced along the rotation axis 26 through the opening 24a, 24b. Airflow is generated in a centrifugal direction based on the rotation of the first or second ventilation fan 25a, 25b.

The second ventilation fan 25b includes fan blades opposed to fan blades of the first ventilation fan 25a at a certain distance. Fins 27 are located in a space between the first and second ventilation fans 25a, 25b. The fins 27 are designed to extend in parallel with each other from the first ventilation fan 25a to the second ventilation fan 25b. Air passages are defined between the adjacent ones of the fins 27. The air passages are designed to extend between the first and second ventilation fans 25a, 25b. The individual fins 27 stand upright from the bottom plate of the casing 23. Heat can thus be transferred to the individual fins 27 through the bottom plate of the casing 23. Airflow passing through the air passages absorbs the transferred heat from the fins 27.

Figure 5:
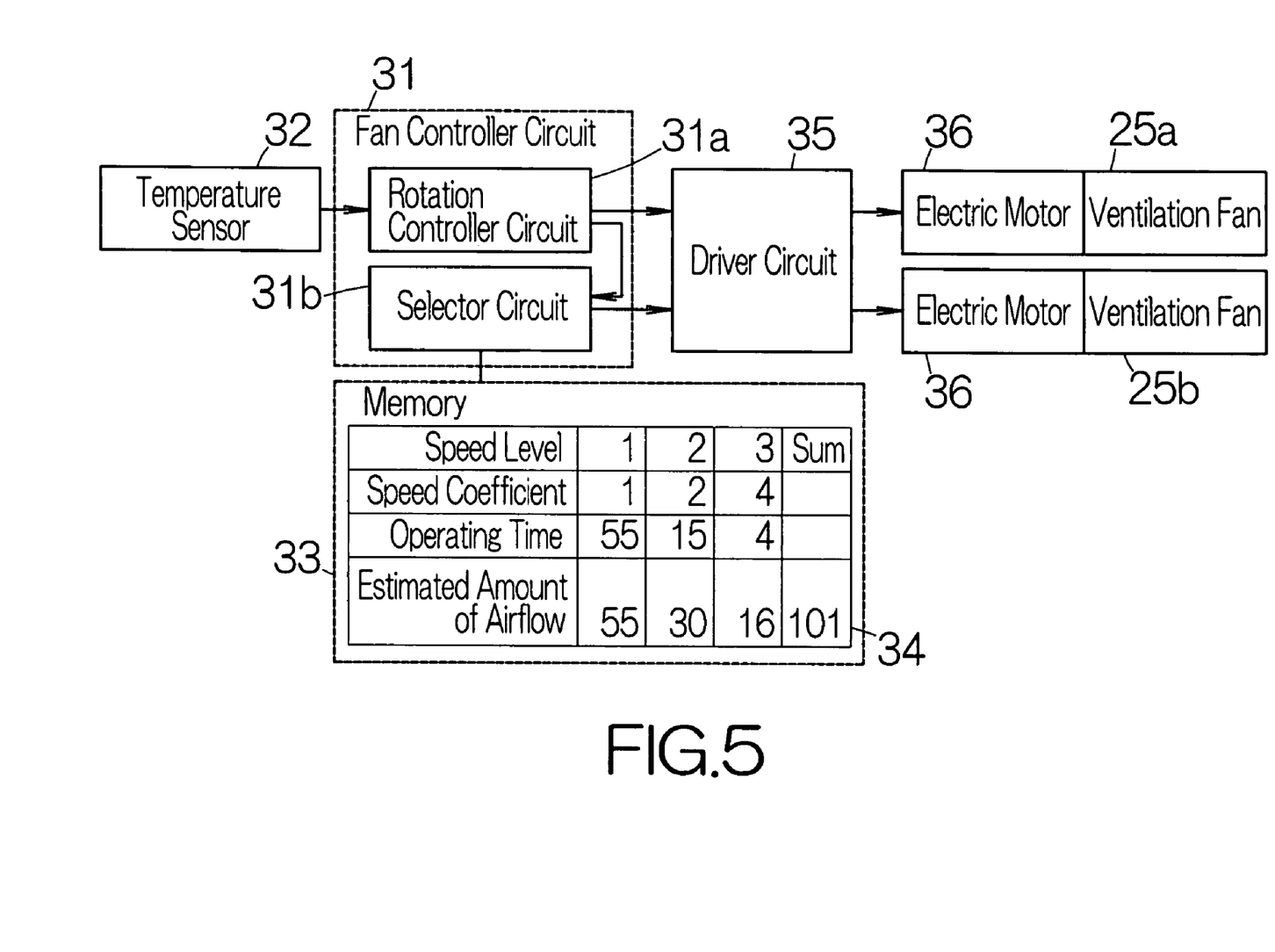
FIG. 5 is a block diagram schematically illustrating a fan controller circuit of the heat radiating apparatus.

As shown in FIG. 5, the heat radiating apparatus 22 includes a fan controller circuit 31. The fan controller circuit 31 includes a rotation controller circuit 31a and a selector circuit 31b. The rotation controller circuit 31a controls the switch-on and switch-off of the first and second ventilation fans 25a, 25b. The rotation controller circuit 31a generates a predetermined control signal for the control. The rotation controller circuit 31a is also allowed to control the rotation speed of the first and second ventilation fans 25a, 25b. Here, the rotation speed is categorized into three different levels. Level 2 is set to realize airflow of an amount equal to twice the amount of airflow corresponding to level 1. Level 3 is set to realize airflow of an amount equal to twice the amount of airflow corresponding to the level 2, namely equal to four times the amount of airflow corresponding to the level 1. The control signal is designed to specify any one of the levels 1, 2 and 3.

The selector circuit 31b selects either one of the first and second ventilation fans 25a, 25b. The selector circuit 31b generates a predetermined control signal specifying the result of the selection. The heat radiating apparatus 22 allows only one of the first ventilation fans 25a, 25b to rotate in response to the control signal supplied from the selector circuit 31b, as described later.

A temperature sensor 32 is connected to the rotation controller circuit 31a. The temperature sensor 32 is designed to detect the temperature of the CPU 19, for example. The temperature sensor 32 may be embedded in the chip of the CPU 19, for example. A temperature information signal is supplied from the temperature sensor 32 to the rotation controller circuit 31a. The temperature information signal specifies the detected temperature of the CPU 19.

A storage circuit such as a memory 33 is connected to the fan controller circuit 31, for example. A data table 34 is established in the memory 33. The data table 34 holds the operating time of the ventilation fan 25a (25b). The operating time is clocked separately for each of the speed level. The operating time may be timed in the selector circuit 31b, for example. The operation of the selector circuit 31b may be controlled in response to a control signal supplied from the rotation controller circuit 31a. The amount of airflow can thus be estimated for the ventilation fan 25a (25b) based on the product between a speed coefficient and the operating time. The speed coefficient may depend on the amount of airflow established for each of the speed levels.

A driver circuit 35 is connected to the rotation controller circuit 31a and the selector circuit 31b. Electric motors 36, 36 of the first and second ventilation fans 25a, 25b are connected to the driver circuit 35. The driver circuit 35 receives the aforementioned control signal from the rotation controller circuit 31a and the selector circuit 31b. The driver circuit 35 supplies a drive signal to either one of the first and second ventilation fans 25a, 25b based on the supplied control signal. Either of the first and second ventilation fans 25a, 25b is driven for rotation by the corresponding electric motor 36 in response to the drive signal. This results in generation of airflow at the designated amount.

When the temperature of the CPU 19 rises beyond a first threshold, the rotation controller circuit 31a instructs the driver circuit 35 to activate either of the first and second ventilation fans 25a, 25b. The driver circuit 35 is supplied with the control signal specifying the speed level 1. In this case, the selector circuit 31b supplies a drive signal to the first ventilation fan 25a, for example. The first ventilation fan 25a operates to introduce air into the casing 23 through the opening 24a. Airflow is generated in the centrifugal direction from the rotation axis 26. The airflow is guided to the air passages between the adjacent fins 27 within the casing 23. The airflow absorbs heat from the fins 27. The heat has been transferred to the fins 27 from the CPU 19 contacting with the bottom plate of the casing 23. The CPU 19 is in this manner allowed to enjoy an efficient heat radiation. The airflow is then discharged out of the casing 23 through the opening 24b. When the temperature of the CPU 19 falls below a second threshold which is lower than the first threshold after a predetermined period has elapsed, the rotation controller circuit 31a serves to deactivate the first ventilation fan 25a.

In case where the temperature of the CPU 19 is still kept higher than the first threshold after the predetermined period has elapsed, the rotation controller circuit 31a sets the upper speed level. The amount of the airflow thus increases within the air passages. Every time the predetermined period has elapsed, the rotation controller circuit 31a sets the upper speed level if the temperature of the CPU 19 is still kept higher than the first threshold. The speed level 3 is in this manner eventually established. The speed level 3 is maintained until the temperature of the CPU 19 falls below the first threshold.

When the temperature of the CPU 19 falls below the first threshold after the predetermined period has elapsed, the rotation controller circuit 31a sets the first lower speed level.

The amount of the airflow thus reduces within the air passages. In case where the speed level 1 has already been established, the rotation controller circuit 31a serves to keep the speed level 1 until the temperature of the CPU 19 falls below the second threshold based on the rotation controller circuit 31a.

The selector circuit 31b repeatedly calculates the amount of the airflow from the first ventilation fan 25a based on the control signal supplied from the rotation controller circuit 31a. When the sum of the estimated amount of the airflow reaches a predetermined threshold, the selector circuit 31b generates a control signal. The generated control signal is supplied to the driver circuit 35. The driver circuit 35 stops supplying the drive signal to the first ventilation fan 25a in response to the control signal. The first ventilation fan 25a is thus deactivated. The driver circuit 35 simultaneously starts supplying the drive signal to the second ventilation fan 25b. The second ventilation fan 25b is thus activated. The driver circuit 35 in this manner realizes the switch-over from the first ventilation fan 25a to the second ventilation fan 25b. The rotation of the second ventilation fan 25b generates airflow through the casing 23 from the opening 24b to the opening 24a.

Figure 6:
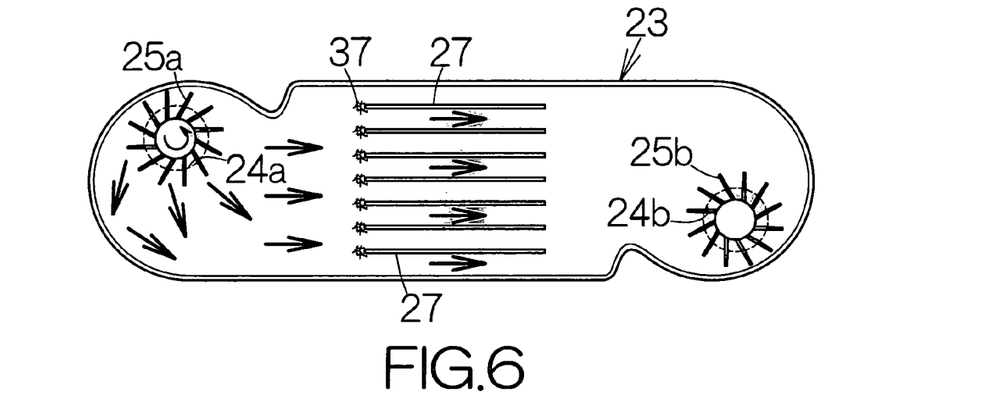
FIG. 6 is a plan view of the heat radiating apparatus for schematically illustrating airflow within a heat sink during the operation of a first ventilation fan.
Figure 7:
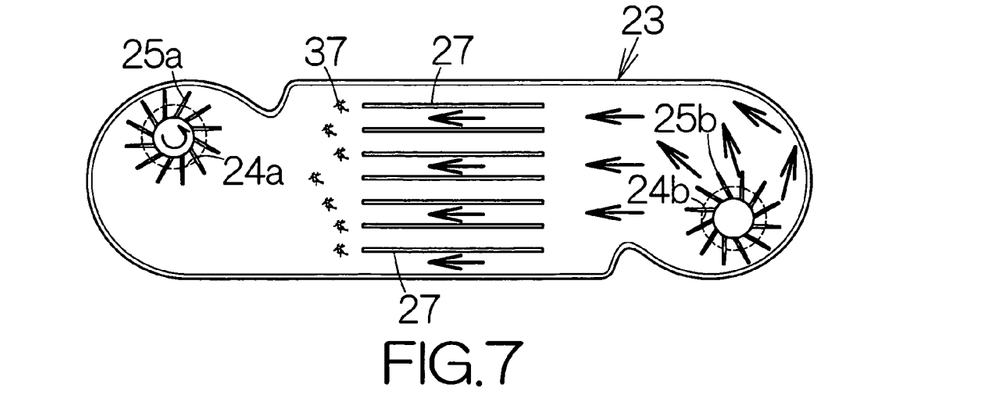
FIG. 7 is a plan view of the heat radiating apparatus for schematically illustrating airflow within the heat sink during the operation of a second ventilation fan.

As shown in FIG. 6, the first ventilation fan 25a generates airflow passing through the casing 23 in a direction from the opening 24a to the opening 24b. Dust 37 sticks to the edges of the fins 27 at the entrances to the air passages near the first ventilation fan 25a. The dust 37 gradually cumulates. As shown in FIG. 7, when the first ventilation fan 25a is deactivated while the second ventilation fan 25b is activated, airflow passes through the casing 23 in the reverse direction from the opening 24b to the opening 24a. Inversion of the airflow is in this manner realized within the air passages. The inverted airflow serves to remove the dust 37 off the edges of the fins 27. The removed dust 37 is blown out of the casing 23 through the opening 24a. The cumulation of the dust 37 can thus reliably be avoided. Accordingly, no dust filter needs to be set in the openings 24a, 24b. Airflow of a sufficient amount is thus reliably maintained in the air passages at any time.

The selector circuit 31b repeatedly calculates the amount of the airflow from the second ventilation fan 25b based on the control signal supplied from the rotation controller circuit 31a after the switch-over. When the sum of the estimated amount of the airflow reaches a predetermined threshold, the driver circuit 35 stops supplying the drive signal to the second ventilation fan 25b. The driver circuit 35 simultaneously starts supplying the drive signal to the first ventilation fan 25a. The first and second ventilation fans 25a, 25b are thus allowed to alternately operate. This structure ensures a reliable avoidance of the cumulation of dust. Airflow of a sufficient amount is always maintained in the air passages.

Figure 8:
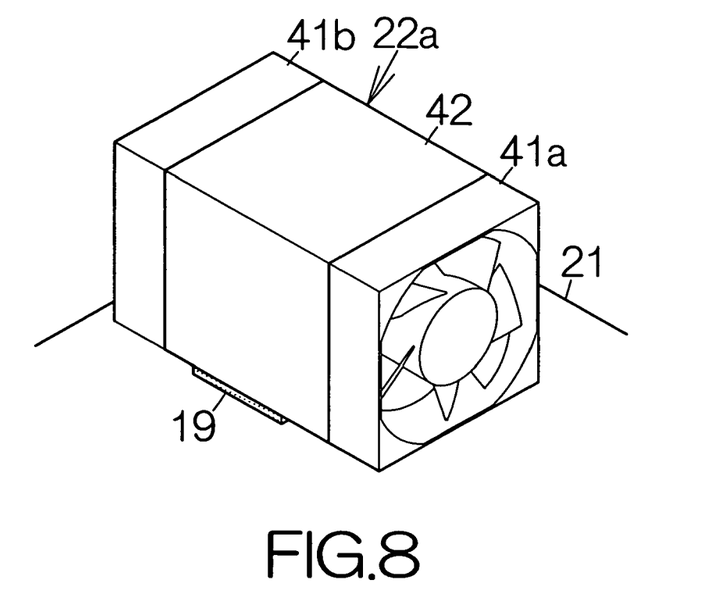
FIG. 8 is an enlarged perspective view schematically illustrating a heat radiating apparatus according to a second embodiment of the present invention.

FIG. 8 schematically illustrates a heat radiating apparatus 22a according to a second embodiment of the present invention. The heat radiating apparatus 22a includes first and second ventilation fans 41a, 41b in the same manner as described above. A so-called axial flow fan is employed as the first and second ventilation fans 4/a, 41b. The rotation axes of the first and second ventilation fans 41a, 41b may be aligned on a common axis. Fan blades of the second ventilation fan 41b are opposed to fan blades of the first ventilation fan 41a at a certain distance.

A heat sink 42 is interposed between the first and second ventilation fans 41a, 41b. The heat sink 42 is received on the upward surface of the CPU 19, for example. The first and second ventilation fans 41a, 41b may be coupled to the heat sink 42. The heat radiating apparatus 22a may be screwed on the printed wiring board 21. An attachment tab, not shown, may be formed integral to the heat sink 42 in this case, for example. A receiving bore may be defined in the attachment tab for receiving the screw.

Figure 9:
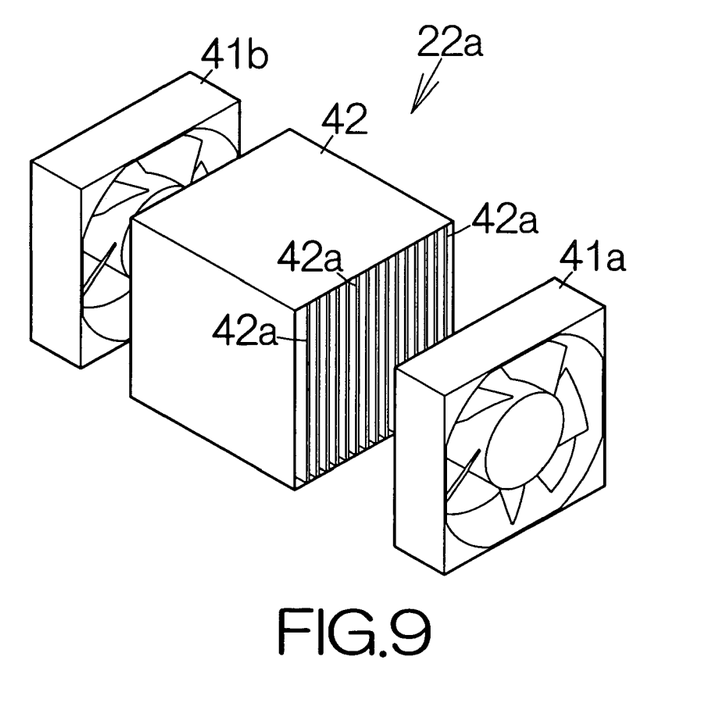
FIG. 9 is an exploded view of the heat radiating apparatus according to the second embodiment.

As shown in FIG. 9, the heat sink 42 includes fins 42a. The fins 42a are designed to extend from the first ventilation fan 41a to the second ventilation fan 41b in parallel with each other. Air passages are defined between the adjacent ones of the fins 42a. The air passages extend between the first and second ventilation fans 41a, 41b. The individual fins 42a stand upright from the bottom plate of the heat sink 42. Heat is thus transferred to the individual fins 42a from the bottom plate of the heat sink 42. The airflow in the air passages absorbs the transferred heat from the fins 42a. The heat radiating apparatus 22a also includes the fan rotation controller circuit 31 as well as the other structure or components employed in the heat radiating apparatus 22 according to the aforementioned first embodiment. The heat radiating apparatus 22a of the type can be utilized in a desktop personal computer, a server computer, or the like, for example.

The heat radiating apparatus 22a allows the first and second ventilation fans 41a, 41b to alternately operate based on the estimated amount of airflow in the same manner as the heat radiating apparatus 22 of the first embodiment. The first ventilation fan 41a operates to generate airflow from the first ventilation fan 41a to the second ventilation fan 41b. The airflow passes through the second ventilation fan 41b at rest. Dust sticks to the edges of the fins 42a at the entrances of the air passages in the vicinity of the first ventilation fan 41a. The dust gradually cumulates. When the first ventilation fan 41a is deactivated while the second ventilation fan 41b is activated, airflow is generated in the reverse direction from the second ventilation fan 41b to the first ventilation fan 41a. Inversion of the airflow is thus realized within the air passages. The reversed airflow serves to remove the dust off the edges of the fins 42a. The removed dust is blown out of the heat sink 42 through the first ventilation fan 41a at rest. The cumulation of dust can thus reliably be avoided. Accordingly, no dust filter is required. Airflow of a sufficient amount is thus always maintained in the air passages.

The second ventilation fan 41b operates to generate airflow from the second ventilation fan 41b to the first ventilation fan 41a. The airflow passes through the first ventilation fan 41a at rest. Dust sticks to the edge of the fins 42a at the entrances of the air passages in the vicinity of the second ventilation fan 41b. The dust gradually cumulates. When driver circuit 35 allows the switch-over from the second ventilation fan 41b to the first ventilation fan 41a, the airflow is reversed again within the air passages. The inverted airflow serves to remove the dust off the edges of the fins 42a as described above. The removed dust is blown out of the heat sink 42 through the second ventilation fan 41b at rest. The cumulation of the dust can thus reliably be avoided.

In general, airflow in one direction is taken into account to optimize the shape of the fan blades in an axial flow fan. In other words, a sufficient amount of airflow cannot be obtained during the reverse rotation of the fan blades in the axial flow fan. On the other hand, an alternate operation of the first and second ventilation fans 41a, 41b as described above realizes airflow of a sufficient amount in the opposite directions.

The aforementioned fan controller circuit 31 may be replaced with the CPU 19 or any other type of microprocessor utilizing a specific software program. The fan controller circuit 31 may also allow the ventilation fans 25a, 25b, 41a, 41b to rotate at the highest speed only for a short while right after the airflow has been inverted. This results in a further reliable removal of dust.

What is claimed is:

1. A heat radiating apparatus, comprising:
   at least a pair of ventilation fans;
   a heat radiating member received on a heat generating object in a space between the ventilation fans, said heat radiating member defining an air passage extending between the ventilation fans, the ventilation fans generating respective airflows a first airflow being generated by a first ventilation fan and being directed towards a second ventilation fan, a second airflow being generated by the second ventilation fan and being directed toward the first ventilation fan, the first airflow and the second airflow being in opposite directions; and
   a controller circuit generating a control signal to control operation of the first and second ventilation fans to generate either the first airflow or the second airflow.

2. The heat radiating apparatus according to claim 1, wherein the controller circuit controls the time of operation of each of the ventilation fans by the generation of the control signal.

3. An electronic apparatus comprising:
   an enclosure;
   an electronic component disposed in the enclosure;
   at least a pair of ventilation fans disposed in the enclosure;
   a heat radiating member received on the electronic component in a space between the ventilation fans, said heat radiating member defining an air passage extending between the ventilation fans, each of the ventilation fans generating airflows a first airflow being generated by a first ventilation fan and being directed towards a second ventilation fan, a second airflow being generated by the second ventilation fan and being directed toward the first ventilation fan, the first airflow and the second airflow being in opposite directions; and
   a controller circuit generating a control signal to control operation of the first and second ventilation fans to generate either the first airflow or the second airflow.

4. The electronic apparatus according to claim 3, wherein:
   the controller circuit controls the time of operation of each of the ventilation fans by the generation of the control signal.

5. The electronic apparatus according to claim 1, wherein:
   the controller circuit alternates whether the first or second airflow is generated as a function of the amount of airflow of the operating ventilation fan.

6. The electronic apparatus according to claim 1, wherein:
   the controller circuit generates a control signal specifying one of plural speed levels of the operating one of the first and second ventilation fans and switches between different speed levels as a function of changes of temperature of an electronic component subjected to the airflow over a prescribed time interval.

7. The electronic apparatus according to claim 3, wherein:
   the controller circuit controls whether the first or second airflow is generated as a function of the amount of airflow of the operating ventilation fan.

8. The electronic apparatus according to claim 3, wherein:
   the controller circuit generates a control signal specifying one of plural speed levels of the operating one of the first and second ventilation fans and switches between different speed levels as a function of changes of temperature of an electronic component subjected to the airflow over a prescribed time interval.

* * * * *